(12) United States Patent
Kwon (10) Patent No.: US 7,808,804 B2
(45) Date of Patent: Oct. 5, 2010

(54) POWER LINE LAYOUT

(75) Inventor: Hyuk-joon Kwon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 305 days.

(21) Appl. No.: 11/979,868

(22) Filed: Nov. 9, 2007

(65) Prior Publication Data
US 2008/0112203 A1  May 15, 2008

(30) Foreign Application Priority Data
Nov. 10, 2006   (KR) ...................... 10-2006-0111224
May 29, 2007   (KR) ...................... 10-2007-0052198

(51) Int. Cl.
*G11C 5/02* (2006.01)

(52) U.S. Cl. ........................... 365/51; 365/63; 365/226

(58) Field of Classification Search .................... 365/51, 365/63, 226
See application file for complete search history.

(56) References Cited

U.S. PATENT DOCUMENTS

| | | | |
|---|---|---|---|
| 6,765,815 B2 | 7/2004 | Fujisawa et al. | |
| 6,765,844 B2 * | 7/2004 | Fujisawa et al. | ....... 365/230.03 |
| 7,161,823 B2 | 1/2007 | Lee et al. | |
| 2002/0057129 A1 * | 5/2002 | Horiguchi et al. | ........... 327/544 |
| 2005/0248042 A1 | 11/2005 | Lee et al. | |
| 2006/0126416 A1 | 6/2006 | Eun et al. | |

FOREIGN PATENT DOCUMENTS

| | | |
|---|---|---|
| JP | 2004-006479 | 1/2004 |
| KR | 10-2001-0002215 | 1/2001 |
| KR | 10-2005-0115196 | 12/2005 |
| KR | 10-2006-0000358 | 1/2006 |
| KR | 10-2006-0066827 | 6/2006 |

* cited by examiner

*Primary Examiner*—Huan Hoang
(74) *Attorney, Agent, or Firm*—Lee & Morse, P.C.

(57) ABSTRACT

A power line layout for a semiconductor device includes a memory cell region, a plurality of wordline enable signal lines in the memory cell region, a plurality of first power lines arranged between the wordline enable signal lines in the memory cell region, and a plurality of second power lines arranged perpendicular to the first power lines in the memory cell region to form a mesh arrangement of first and second power lines.

20 Claims, 8 Drawing Sheets

POWER LINE LAYOUT

BACKGROUND OF THE INVENTION

1. Field of the Invention

The present invention relates to a power line layout and, more particularly, to a power line layout that may provide a reduction of noise and an increase in power supply efficiency in a semiconductor device.

2. Description of the Related Art

In general, a semiconductor device may include a plurality of memory cells arranged at predetermined intervals in a grid structure. A bit line sense amplifier may be disposed at a first side of each of the memory cell regions, and a sub wordline driver may be disposed at a second side of each of the memory cell regions, for example. A region in which the bit line sense amplifier is disposed may be referred to as a sense amplifier region, and a region in which a sub wordline driver is disposed may be referred to as a sub wordline driver region.

Typically, a semiconductor device may receive power through horizontally or vertically arranged power lines. The power lines may be utilized to drive memory cell regions and bit line sense amplifiers. Conventional power lines may be divided into a plurality of first power lines vertically arranged in the sense amplifier region and a plurality of second power lines horizontally arranged in the memory cell region and the sub wordline driver region. The first power lines may be located at a position lower than the second power lines in the semiconductor device. In other words, in the semiconductor device, the power lines may be arranged in a two-layer structure.

Various voltages may be supplied to the semiconductor device through the power lines. The number of voltages supplied through the power lines may vary. For example, the number of voltages supplied through the power lines may be determined based at least, in part, on how many voltages the semiconductor device may utilize for operation.

Furthermore, the number of power lines employed in a semiconductor device may be determined based at least, in part, on characteristics of the semiconductor device. As a few examples, the number of first and second power lines to be employed in a semiconductor memory device may depend at least, in part, on the capacity of the semiconductor memory device, a wordline enable signal line pitch of the semiconductor memory device and/or wordline enable signal line width of the semiconductor memory device.

The first power lines may be vertically arranged in the sense amplifier region, and the second power lines may be horizontally arranged in the sub wordline driver region. The first and second power lines may be connected using via contacts in a mesh structure in a manner such that the connected first and second power lines have the same voltage levels. For example, power lines of the first power lines receiving a high voltage may be connected to power lines of the second power lines receiving a high voltage through via contacts. In a conventional power line layout, power supplied through the second power may be utilized as main power.

Wordline enable signal lines may be vertically arranged in the memory cell region. The wordline enable signal lines may be arranged in the same layer as the first power lines or the second power lines. In operation, noise may be generated in the power lines. Increasing the number of via contacts may distribute noise, but the layout of the semiconductor device may limit the ability to increase the number of via contacts. Additionally, reducing the power may decrease the generation of noise, but may additionally decrease the operating speed of a semiconductor device. A need, therefore, exists for a power line layout that addresses one or more of these limitations of the conventional art.

SUMMARY OF THE INVENTION

Embodiments are therefore directed to a power line layout for a semiconductor device that may provide a reduction of noise and an increase in power supply efficiency as compared with the conventional art.

It is therefore a feature of an embodiment of the present invention to provide a power line layout for a semiconductor device that may have multiple power line layers.

At least one of the above and other features of the present invention may be realized by providing a power line layout for a semiconductor device, including a memory cell region, a plurality of wordline enable signal lines in the memory cell region, a plurality of first power lines arranged between the wordline enable signal lines in the memory cell region, and a plurality of second power lines arranged perpendicular to the first power lines in the memory cell region to form a mesh arrangement of first and second power lines.

A plurality of via connectors may connect portions of the first and second power lines in the memory cell region. The memory cell region may include a first memory cell region and a second memory cell region. The second memory cell region may further include a sub wordline driver region.

The first and second power lines may be connected in a mesh arrangement in the sub wordline driver region. The sub wordline driver region may be located at one side of the second memory cell region. Each of the first power lines may be disposed between two neighboring wordline enable signal lines at a predetermined distance from the neighboring wordline enable signal lines. At least one of the first power lines may be a high voltage power line. At least a portion of the first and second power lines may have differing voltage levels.

At least a portion of the wordline enable signal lines may be employed as power lines. At least a portion of the second power lines may be employed as global input/output lines (GIO).

At least one other of the above and other features of the present invention may be realized by providing a power line layout for a semiconductor device, including a memory cell region, a plurality of wordline enable signal lines in the memory cell region, at least one wordline coupled to each of the plurality of wordline enable signal lines, a plurality of first power lines arranged between wordline enable signal lines in the memory cell region, a plurality of second power lines arranged perpendicular to the first power lines in the memory cell region to form a mesh arrangement of first and second power lines, a plate poly located under the memory cell region, and a plurality of via contacts connecting the poly plate with at least a portion of the first power lines.

A plurality of via contacts may connect portions of the first and second power lines. The first power lines connected to the poly plate may be configured to receive a bias voltage. The bias voltage may be a high voltage.

The memory cell region may include a first memory cell region and a second memory cell region. At least a portion of the wordline enable signal lines may be employed as power lines. At least a portion of the second power lines may be employed as global input/output lines (GIO). The first power lines are formed of the same material as the wordline enable signal lines.

At least one other of the above and other features of the present invention may be realized by providing a power line layout for a semiconductor device, including a memory cell region, a plurality of wordline enable signal lines in the memory cell region, a plurality of first power lines arranged between wordline enable signal lines in the memory cell region, a plurality of second power lines arranged perpendicular to the first power lines in the memory cell region, a plurality of third power lines arranged perpendicular to the second power lines in the memory cell region to form a mesh arrangement of first, second and third power lines, and a plurality of via contacts connecting portions of the first and second power lines, and portions of the second and third power lines.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application Nos. 10-2006-0111224, filed on Nov. 10, 2006, and 10-2007-0052198, filed on May 29, 2007, in the Korean Intellectual Property Office, and entitled: "Power Line Layout," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. Furthermore, if a first element is described as being coupled to a second element, the first element may be not only directly coupled to the second element but may also be indirectly coupled to the second element via one or more additional elements. Further, elements that are not essential to the complete understanding of the invention are omitted for clarity.

Figure 1:
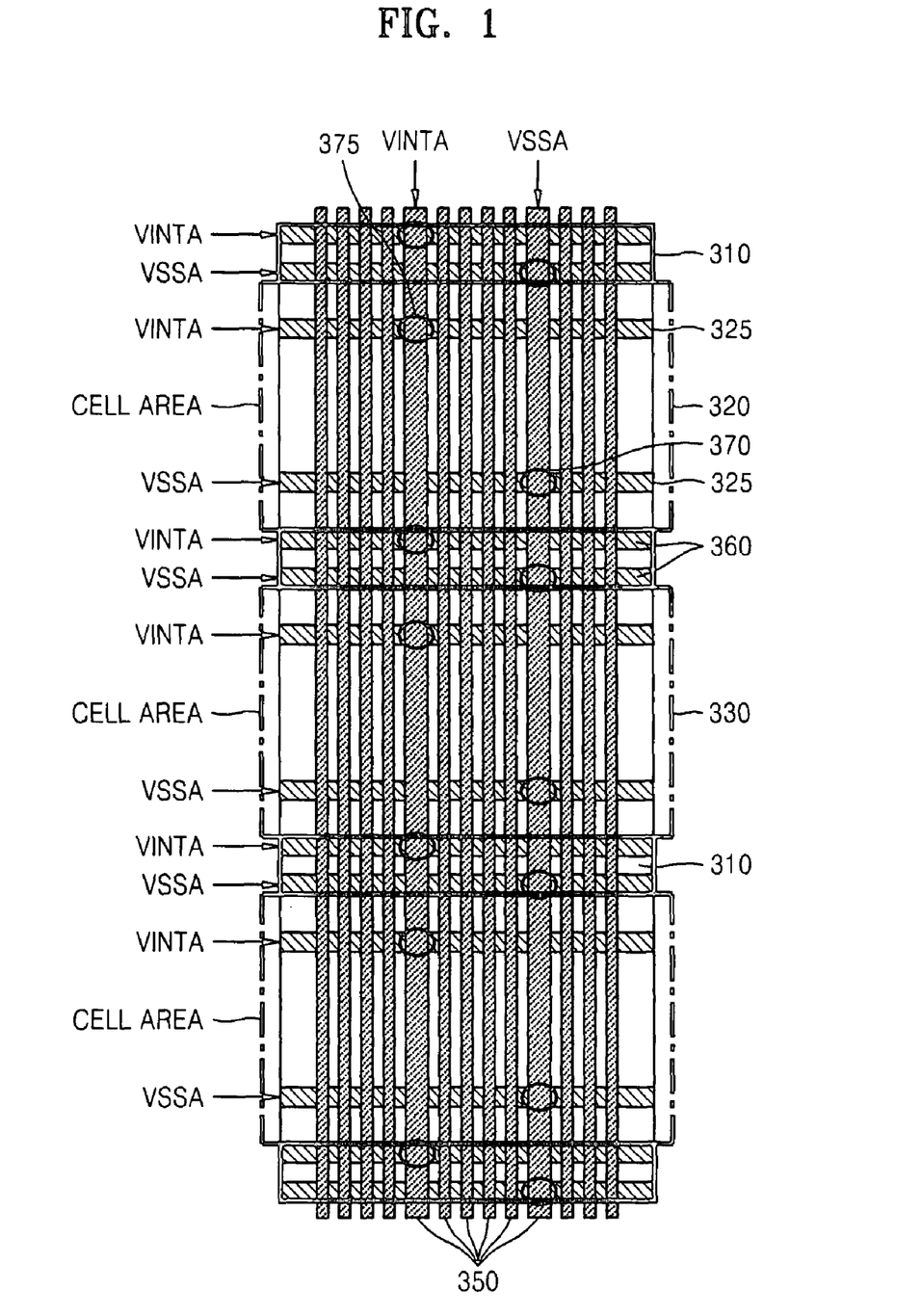
FIG. 1 illustrates a schematic view of a power line layout according to an embodiment of the present invention.

Referring to FIG. 1, a schematic view of a power line layout according to an embodiment of the present invention is illustrated. The power line layout may be for a semiconductor device, such as a memory device, although the scope of the present invention is not so limited.

Various voltages may be supplied by employing one or more of the power lines illustrated in FIG. 1, including high power voltages and/or low power voltages. For example, VSSA denotes a low power voltage supplied to a core cell or memory cell region that may be coupled to one or more of the power lines. VINTA denotes an internal voltage supplied to core cell or memory cell region that may be coupled to one or more of the power lines. The number of voltages supplied by the power lines may vary. For example, the number of voltages supplied by employing the power lines may depend at least in part on a semiconductor device that may be coupled to the power lines, for example. In general, however, a low power voltage VSS (not shown), a low power voltage VSSA for a core cell or memory cell region, a high voltage VP (not shown), an internal voltage VINTA for a core cell or memory cell region, and a bit line precharge voltage VBL (not shown) may be employed to operate a semiconductor device.

Continuing with FIG. 1, the power line layout includes first power lines 350 and second power lines 325 and 360. The first power lines 350 may be vertically arranged in the memory cell region 320 and the sub wordline driver region 310. The second power lines 325 and 360 may be horizontally arranged in the memory cell region 320, the memory cell region 330 and the sub wordline driver region 310. Additionally, a bit line sense amplifier region (not shown) may be included in the power line layout illustrated in FIG. 1.

The second power lines 325 and 360 may be located above or below the first power lines 350. Via contacts may be formed at intersections 370 and 375 between the first and second power lines, and may connect second power lines 325 and 360 with first power lines 350. The intersections 370 and 375 of first and second power lines may, in operation, have the same voltage levels. This connection structure utilizing via contacts may be referred to as a mesh structure. In operation, at least some of the second power lines 325 may receive a low power voltage VSSA for a core cell, and the first power lines 350 that intersect the at least some power lines 325 may receive the same low power voltage level VSSA at the intersections 370.

In this embodiment, unlike a conventional power line layout, the first power lines 350 may be vertically arranged, or arranged in parallel with wordline enable signal lines (not shown) in the memory cell region 320. Therefore, intersections may be formed between the first and second power lines 350 and 325 in the memory cell region 320, which may increase the number of the intersections in the power line layout.

If the second power lines 325 and 360 are utilized as main power supply lines, an electrical resistance between the first power lines 350 and the second power lines 325 and 360 may be efficiently distributed and may be reduced, due at least in part to the increased number of intersections between the first power lines 350 the second power lines 325 and 360. Therefore, noise may be efficiently distributed. In addition, power may be sufficiently supplied through the first power lines 350, which may increase power supply efficiency.

Figure 2:
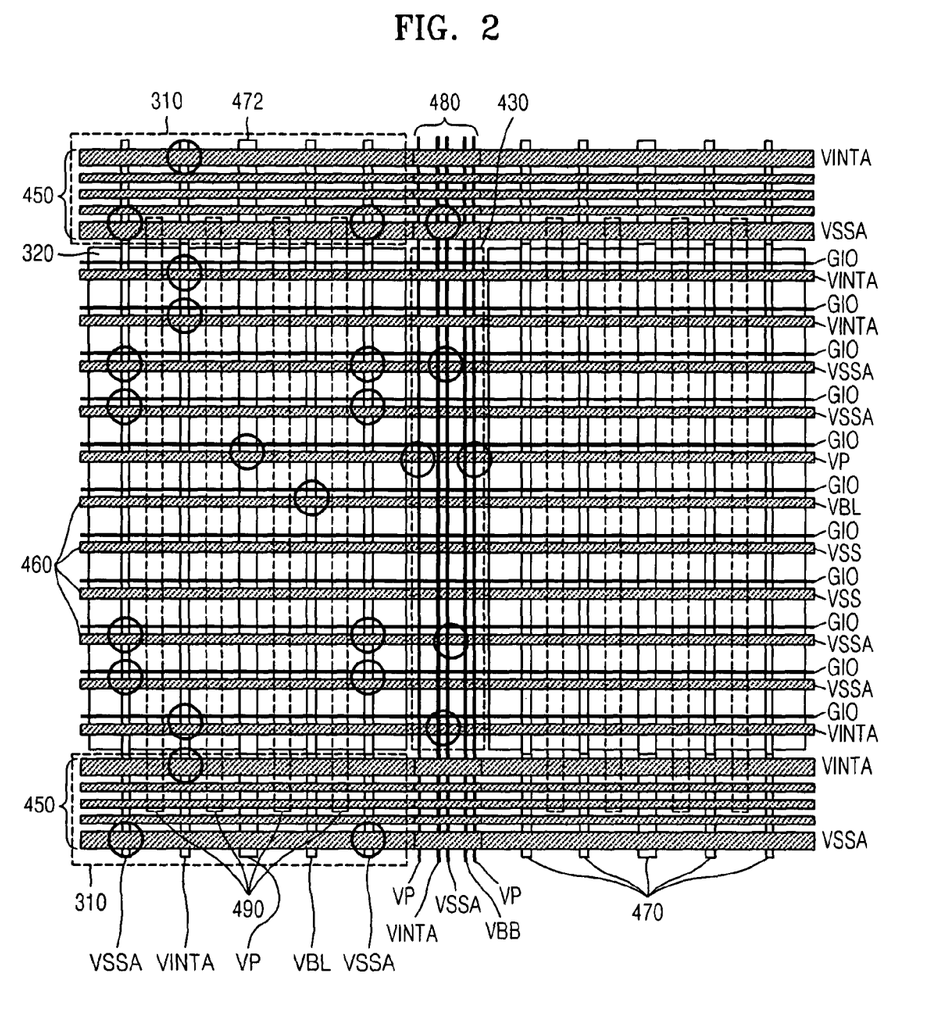
FIG. 2 illustrates a schematic view of a power line layout according to an embodiment of the present invention.

FIG. 2 illustrates a schematic view of a power line layout according to another embodiment of the present invention. The power line layout may be utilized in a semiconductor device, such as a memory device, although the scope of the present invention is not so limited.

Various voltages may be supplied by employing one or more of the power lines, including high power voltages and/or low power voltages. For example, a low power voltage VSSA, and internal voltage VINTA, a bit line precharge voltage VBL, a low power voltage VSS and a high voltage VP may be provided to one or more of the power lines illustrated in FIG. 2. Furthermore, the number and type of voltages supplied by employing the power lines may depend at least, in part, on a semiconductor device that may be coupled to the power lines, for example. Furthermore, the power line layout may include a plurality of data signal lines such as global input/output (GIO) lines.

First power lines 470 and 480 may be vertically arranged in parallel with wordline enable signal lines 490. One or more of the first power lines 470 and 480 may be disposed between two neighboring wordline enable signal lines 490 at a predetermined distance from the wordline enable signal lines 490.

The first power lines 470 and 480 may contact second power lines 450 and 460 and may, in operation, have the same voltage levels as the first power lines 470. Intersections where the first and second power lines 470, 480, 450, and 460 may contact one other are denoted by circles in FIG. 2. In the power line layout of the current embodiment, the first power lines 470 and 480 may be arranged in memory cell region 320 in parallel with the wordline enable signal lines 490 such that a plurality of contacts may exist in the memory cell regions 320. In operation, if additional GIO lines are necessary, the second power lines 450 and 460 may be employed as GIO lines for inputting and outputting data, although the scope of the present invention is not so limited.

The second power lines 450 and 460 may be horizontally arranged in the memory cell region 320 and sub wordline driver regions 310 in a direction perpendicular to the wordline enable signal lines 490.

A power line 472 of the first power lines 470 may be disposed along the centerline of the memory cell region 320 and may, in operation, receive the high voltage VP. Since the power line 472 receiving the high voltage VP may carry the highest power, the power line 472 may be disposed along the centerline of each of the memory cell region 320.

The first power lines 470 and 480 may be arranged under the second power lines 450 and 460. In the current embodiment, the power line layout has a two-layer structure: one layer for the first power lines 470 and 480, and the other layer for the second power lines 450 and 460. Although the power line layout of the current embodiment does not have a three-layer structure, the power line layout may reduce the resistance of power lines and thus provide improved noise distribution effect and an improved power supply layout as compared to the conventional art. Furthermore, since the first power lines 470 and 480 are arranged across the second power lines 460 to form a mesh structure in the memory cell regions 320, sufficient power may be supplied to the memory cell regions 320.

The number of the first and second power lines 470, 480, 450, and 460 may vary depending at least, in part, on characteristics of a semiconductor device employing the power line layout. For example, characteristics such as memory capacity and operating speed may cause a particular number of power lines of a power line layout to vary. Therefore, a manufacturer may adjust the number of first and second power lines according to the characteristics of a semiconductor device employing the power lines.

Figure 3A:
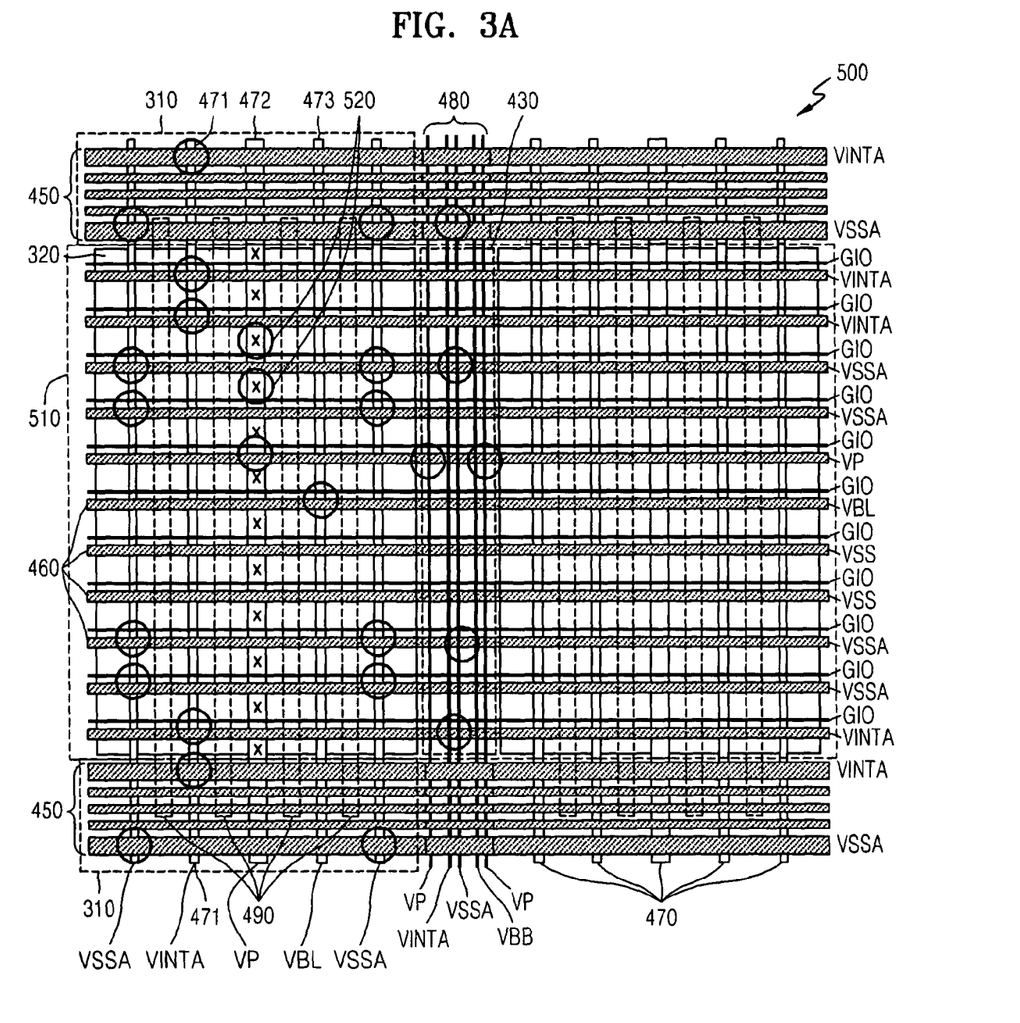
FIG. 3A illustrates a schematic view of a power line layout according to another embodiment of the present invention.

FIG. 3A illustrates a power line layout 500 according to another embodiment of the present invention.

Referring to FIG. 3A, the power line layout 500 may be similar to the power line layout illustrated in FIG. 2, with the addition of a plate poly 510. A first power line 472 disposed in a first memory cell region 320 may be connected to the plate poly 510 through metal contacts 520. In addition, other first power lines 471, 473, and 470 may be connected to the plate poly 510 though metal contacts 520.

In operation, the first power line 472 may receive a bias voltage. For example, the metal contacts 520 may be formed by forming a metal line such as the first power line 472 on a substrate such as the plate poly 510, forming contact points at predetermined intervals between the first power line 472 and the plate poly 510, and filling the contact points with metal. The formation method of the metal contacts 520 is well known to one of ordinary skill in the related art, and therefore will not be described in detail.

The bias voltage to the first power line 472 may be equal to a high voltage VP, for example. In operation, the bias voltage may be utilized to bias other voltages. The first power line 472 that may receive the bias voltage may be disposed along the centerline of the memory cell region 320.

As mentioned previously, the first power lines 471, 472, 473, and 470 may be connected to the plate poly 510 using the metal contacts 520. This may result in noise being reduced when power is supplied through the first lines 471, 472, 473, and 470.

Figure 3B:
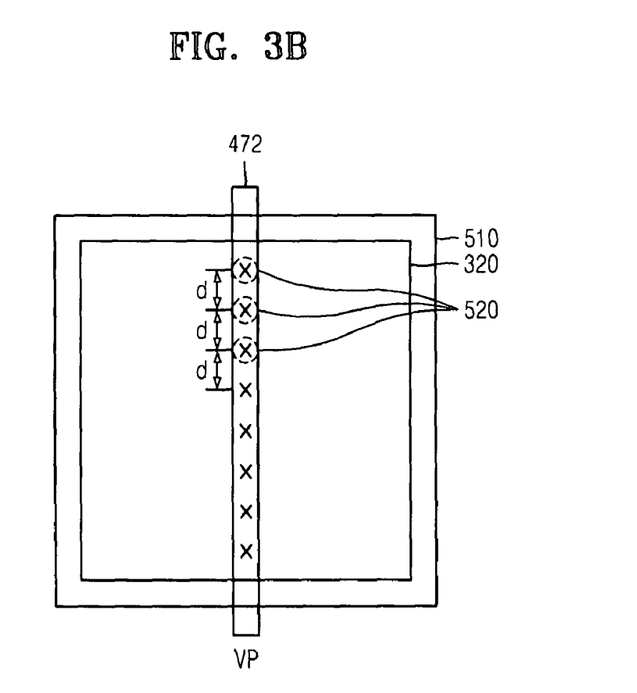
FIG. 3B illustrates a schematic view of contacts between a plate poly and a first power line receiving a bias voltage in FIG. 3A, according to an embodiment of the present invention.

FIG. 3B illustrates a power line layout according to an embodiment of the present invention. In FIG. 3B, the metal contacts 520 between the plate poly 510 and first power line 472 may receive a bias voltage. The metal contacts 520 may be formed between the first power line 472 and the plate poly 510 and may be spaced a distance (d) apart from each other. The distance (d) may be varied based at least in part on characteristics of a semiconductor device. A noise distributing effect may be improved by reducing the distance (d) and increasing the number of the metal contacts 520, for example.

Figure 3C:
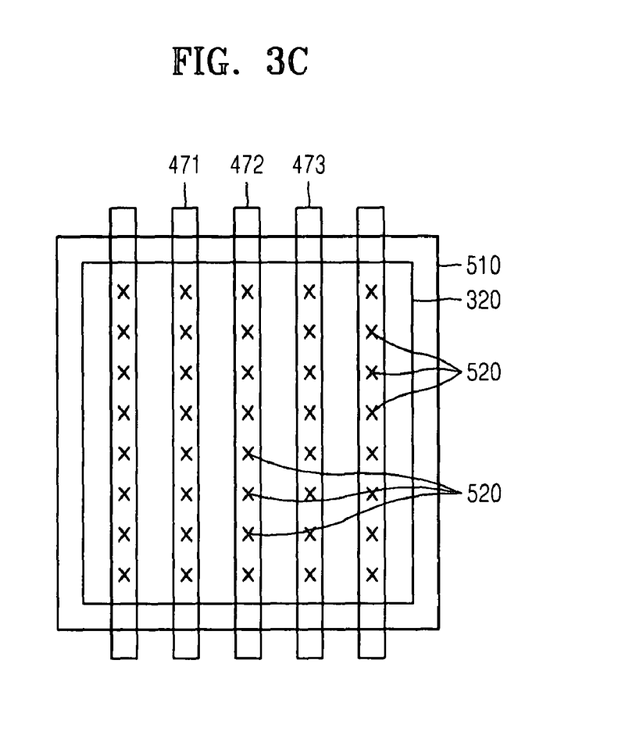
FIG. 3C illustrates a schematic view of contacts between the plate poly and the first power lines illustrated in FIG. 3A, according to an embodiment of the present invention.

FIG. 3C illustrates a power line layout according to an embodiment of the present invention. In FIG. 3C the metal contacts 520 may be formed between the plate poly 510 and the first power lines 471, 472, and 473. The first power lines 471, 472, and 473 may be connected to the plate poly 510 through the metal contacts 520. A noise distribution effect may be increased by electrically connecting the first power lines 471, 472, and 473 to the plate poly 510 using the metal contacts 520.

Figure 4A:
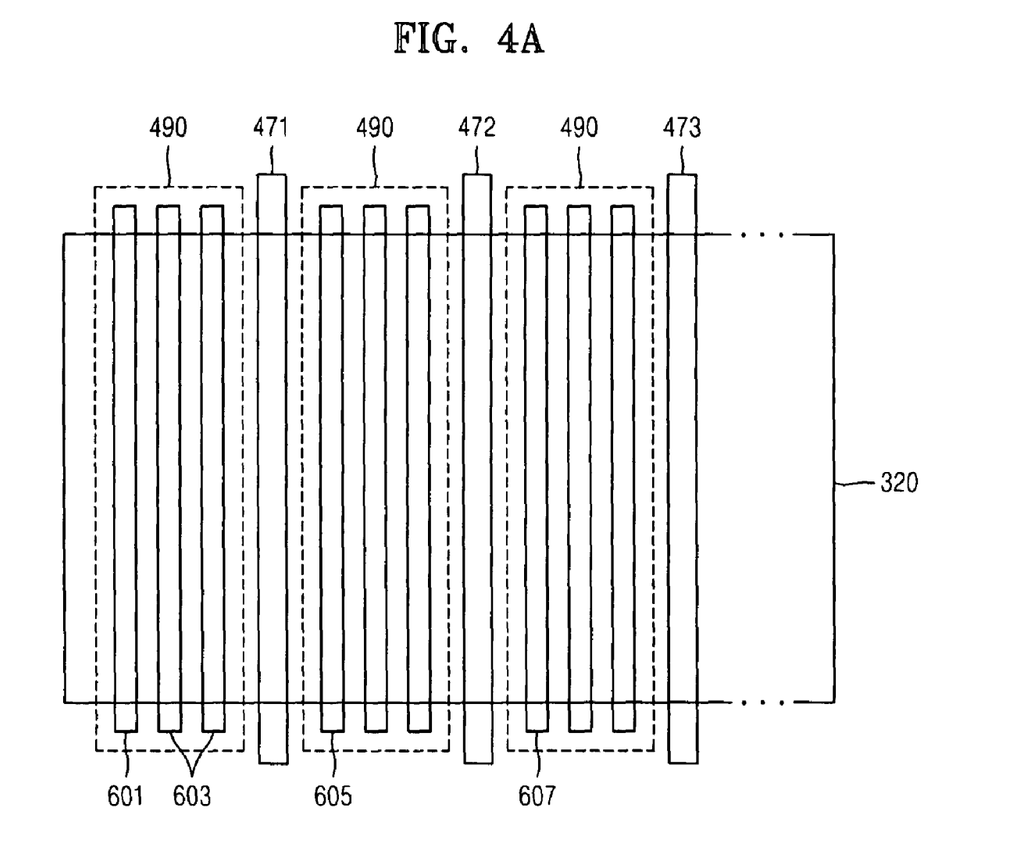
FIG. 4A illustrates a schematic view of an arrangement of wordline enable signal lines and formation of additional wordline enable signal lines in FIG. 3A, according to an embodiment of the present invention.

FIG. 4A illustrates a power line layout according to an embodiment of the present invention. In FIG. 4A, wordline enable signal lines 490 may be included in the power line layout. One or more of wordline enable signal lines 490 may comprise active or idle wordlines, for example. However, if the power line layout is for a memory device having a 256, 512, or 1024 cell structure, no idle wordline enable signal line may be utilized. It is apparent to one of ordinary skill in the related art that no while no idle wordline enable signal line may be utilized in a 256, 512, or 1024 cell structure, idle wordline enable signal lines exist in 320 and 640 cell structures. In other words, in the 320 and 640 cell structures, all wordline enable signal lines are not used.

The wordline enable signal lines 490 may be individually arranged at predetermined intervals. Alternatively, the wordline enable signal lines 490 may be arranged in groups. For example, two or more wordline enable signal lines (e.g., three wordline enable signal lines 601 and 602) may be included in a wordline enable signal line group 490.

In the current embodiment, when idle wordline enable signal lines are not utilized, additional wordline enable signal lines may be formed. The additional wordline enable signal lines may be used as global input/output (GIO) lines or first power lines. Alternatively, the additional wordline enable signal lines or the idle wordline enable signal lines may be referred to as dummy wordline enable signal lines.

In FIG. 4A, one or more dummy wordline enable signal lines may be included in a wordline enable signal line group. For example, reference numerals 601, 605, and 607 may denote dummy wordline enable signal lines.

Figure 4B:
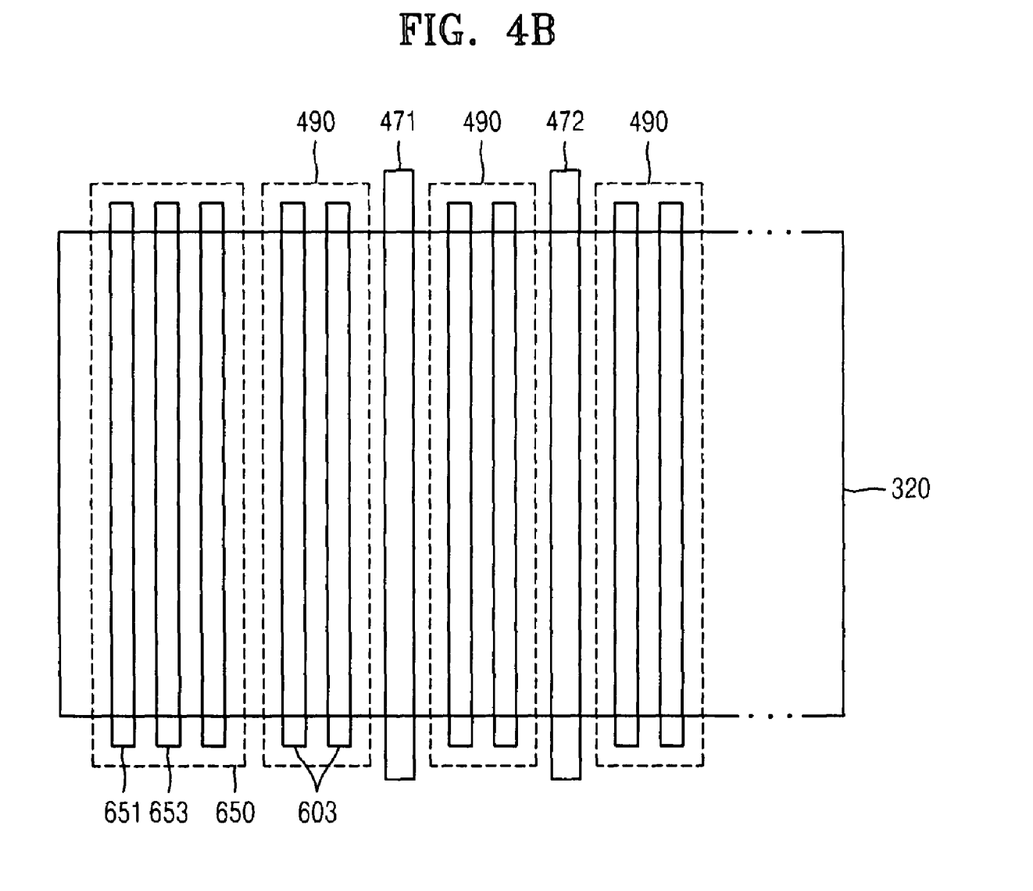
FIG. 4B illustrates a schematic view of an arrangement of wordline enable signal lines and formation of additional wordline enable signal lines in FIG. 3A, according to another embodiment of the present invention.

FIG. 4B illustrates an arrangement of the wordline enable signal lines 490 and the formation of additional wordline enable signal lines such as the wordline enable signal lines illustrated in FIG. 3A, according to another embodiment of the present invention.

In FIG. 4B, dummy wordline enable signal lines may be grouped at one side of the memory cell array 320. The dummy wordline enable signal lines may be arranged in a side area 650 of the memory cell region 320, while wordline enable signal line groups 490 are arranged in the other area of the memory cell region 320. However, it is worthwhile to note that the dummy wordline enable signal lines may be arranged in various manners, and the scope of the present invention is not so limited.

Figure 5:
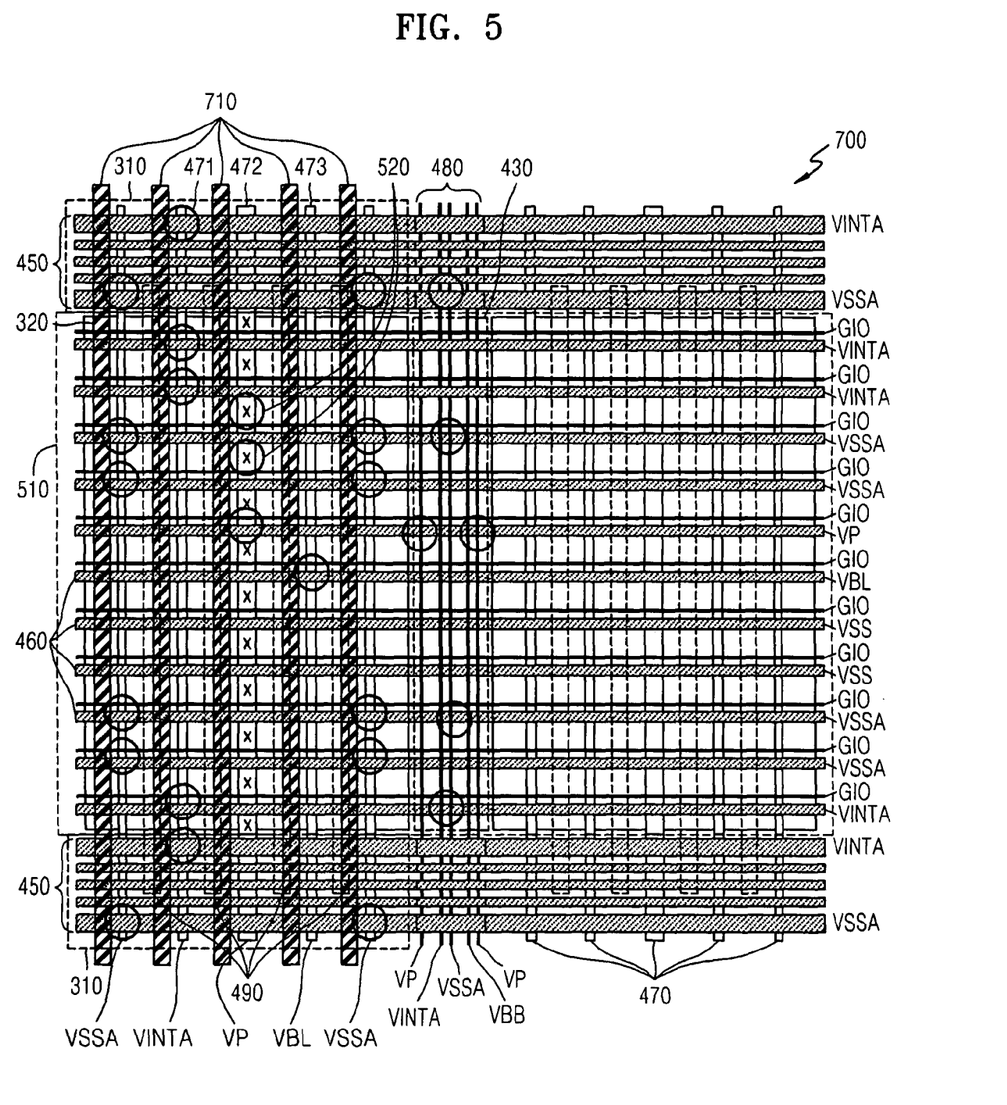
FIG. 5 illustrates a schematic view of a power line layout according to another embodiment of the present invention.

FIG. 5 illustrates a power line layout 700 according to another embodiment of the present invention.

Referring to FIG. 5, the power line layout 700 may include a third region including third power lines 710, which may be in addition to the power line layout illustrated in FIG. 3A. The third region may be located above the second power lines 460. That is, the third region may be located above a memory cell region 320. The power line layout 700 may further include a sub wordline driver region 450 and/or a sense amplifier region 430. The third power lines 710 may be arranged in the same direction as first power lines 471, 472, and 473.

The third power lines 710 may be connected to second power lines 460 having the same voltage levels as the third power lines 710 in a mesh structure. For example, the third power lines 710 may be connected to second power lines 460 through via contacts. The other structures of the power line layout 700 may be the same as those of the power line layouts illustrated in FIGS. 2 through 3B. Accordingly, descriptions of the other structures of the power line layout 710 will be omitted.

Figure 6:
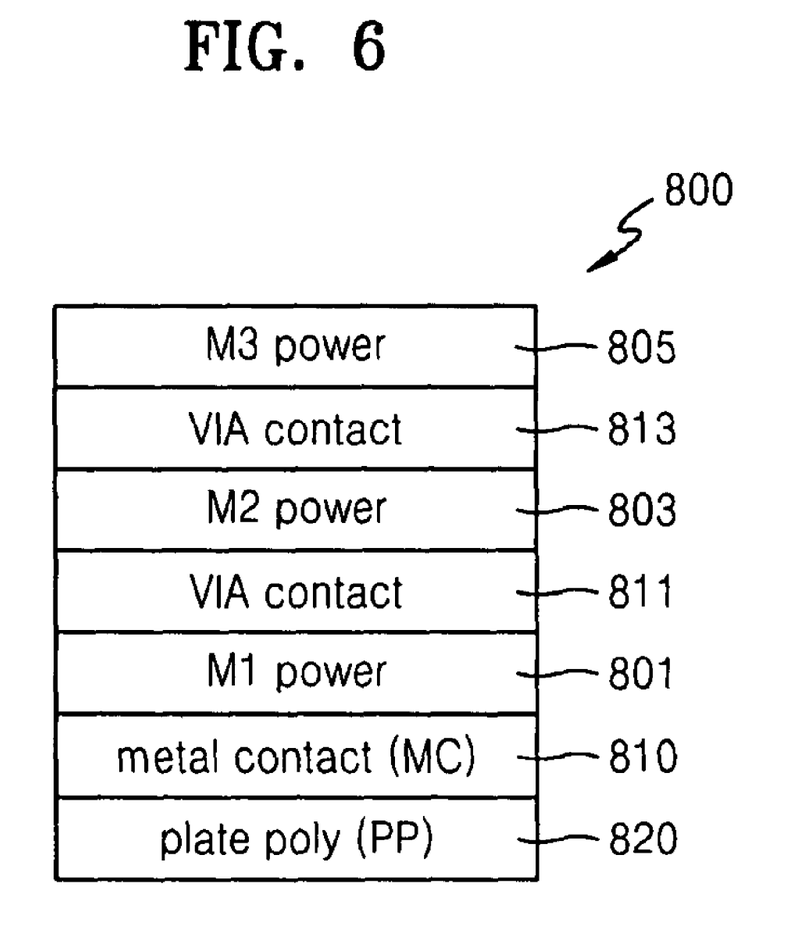
FIG. 6 illustrates a block diagram of components of a semiconductor device according to an embodiment of the present invention.

FIG. 6 illustrates a block diagram of an arrangement of elements depicted in one or more of FIGS. 1 through 5 in a vertical direction according to an embodiment of the present invention.

Referring to FIG. 6, a plate poly 820 may form the lowest layer of the arrangement of a power line layout. Then, a metal contact 810, a first power line 801, a via contact 811, a second power line 803, a via contact 813, and a third power line 805 may be sequentially formed on the plate poly 820 to form a structure 800.

As described above, according to the power line layout of the present invention, a small-sized semiconductor device having an improved power supply ability and low noise characteristic may be manufactured. The cost of manufacturing such a device may be reduced as compared to semiconductor devices in the conventional art, for example.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A power line layout for a semiconductor device, comprising:
    a sub wordline driver region;
    a memory cell region adjacent to the sub wordline driver region;
    a plurality of wordline enable signal groups including at least one wordline enable signal line in the memory cell region, each wordline enable signal line being separated from an adjacent wordline enable signal line in the sub wordline driver region;
    a plurality of first power lines having various voltage levels arranged between the wordline enable signal groups in the memory cell region, the first power lines and wordline enable signal groups being alternately arranged in the memory cell region; and
    a plurality of second power lines having various voltage levels arranged perpendicular to the first power lines in the memory cell region to form a mesh arrangement of first and second power lines.

2. The power line layout for a semiconductor device as claimed in claim 1, wherein a plurality of via connectors connects portions of the first and second power lines having substantially the same voltage levels in the memory cell region.

3. The power line layout for a semiconductor device as claimed in claim 2, wherein the memory cell region includes a first memory cell region having a first plurality of wordline enable signal groups and a second memory cell region having a second plurality of wordline enable signal groups.

4. The power line layout for a semiconductor device as claimed in claim 3, wherein the first and second power lines are connected in a mesh arrangement in the sub wordline driver region.

5. The power line layout for a semiconductor device as claimed in claim 3, wherein a second sub wordline driver region is located adjacent to the second memory cell region.

6. The power line layout for a semiconductor device as claimed in claim 1, wherein each wordline enable signal line is separated from an adjacent wordline enable signal line in the memory cell region.

7. The power line layout for a semiconductor device as claimed in claim 1, wherein each of the first power lines is disposed between the adjacent wordline enable signal group at a predetermined distance from the neighboring wordline enable signal group.

8. The power line layout for a semiconductor device as claimed in claim 1, wherein at least one of the first power lines is a high voltage power line.

9. The power line layout for a semiconductor device as claimed in claim 1, wherein at least a first portion of the first and second power lines has differing voltage levels from a second portion of the first and second power lines.

10. The power line layout for a semiconductor device as claimed in claim 1, wherein at least a portion of each wordline enable signal line is employable as a power line.

11. The power line layout for a semiconductor device as claimed in claim 1, wherein at least a portion of each second power lines is employable as a global input/output line (GIO).

12. A power line layout for a semiconductor device, comprising:
- a sub wordline driver region;
- a memory cell region;
- a plurality of wordline enable signal groups including at least one wordline enable signal line in the memory cell region, each wordline enable signal line being separated from an adjacent wordline enable signal line in the sub wordline driver region;
- at least one wordline coupled to each of the plurality of wordline enable signal lines;
- a plurality of first power lines having various voltage levels arranged between wordline enable signal groups in the memory cell region, the first power lines and the wordline enable signal groups being alternately arranged in the memory cell region;
- a plurality of second power lines having various voltage levels arranged perpendicular to the first power lines in the memory cell region to form a mesh arrangement of first and second power lines;
- a plate poly located under the memory cell region; and
- a plurality of via contacts connecting the poly plate with at least a portion of the first power lines.

13. The power line layout for a semiconductor device as claimed in claim 12, wherein a plurality of via contacts connects portions of the first and second power lines having substantially the same voltage levels in the memory cell region.

14. The power line layout for a semiconductor device as claimed in claim 12, wherein the first power lines connected to the poly plate are configured to receive a bias voltage.

15. The power line layout for a semiconductor device as claimed in claim 14, wherein the bias voltage is a high voltage.

16. The power line layout for a semiconductor device as claimed in claim 12, wherein the memory cell region includes a first memory cell region having a first plurality of wordline enable signal groups and a second memory cell region having a second plurality of wordline enable signal groups.

17. The power line layout for a semiconductor device as claimed in claim 12, wherein at least a portion of each wordline enable signal line is employable as a power line.

18. The power line layout for a semiconductor device as claimed in claim 12, wherein at least a portion of each second power lines is employable as a global input/output line (GIO).

19. The power line layout for a semiconductor device as claimed in claim 12, wherein the first power lines are formed of the same material as the wordline enable signal lines.

20. A power line layout for a semiconductor device, comprising:
- a sub wordline driver region;
- a memory cell region adjacent to the sub wordline driver region;
- a plurality of wordline enable signal groups including at least one wordline enable signal line in the memory cell region, each wordline enable signal line being separated from an adjacent wordline enable signal line in the sub wordline driver region;
- a plurality of first power lines having various voltage levels arranged between wordline enable signal groups in the memory cell region, the first power lines and the wordline enable signal groups being alternately arranged in the memory cell region;
- a plurality of second power lines having various voltage arranged perpendicular to the first power lines in the memory cell region;
- a plurality of third power lines arranged perpendicular to the second power lines in the memory cell region to form a mesh arrangement of first, second and third power lines; and
- a plurality of via contacts connecting portions of the first and second power lines, and portions of the second and third power lines.

* * * * *